(12) United States Patent
Yanagita et al.

(10) Patent No.: US 9,087,888 B2
(45) Date of Patent: Jul. 21, 2015

(54) SEMICONDUCTOR DEVICE AND ELECTRONIC APPARATUS

(71) Applicant: Sony Corporation, Tokyo (JP)

(72) Inventors: Masashi Yanagita, Kanagawa (JP); Shigeru Kanematsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/189,423

(22) Filed: Feb. 25, 2014

(65) Prior Publication Data

US 2014/0252417 A1 Sep. 11, 2014

(30) Foreign Application Priority Data

Mar. 6, 2013 (JP) .................... 2013-044019

(51) Int. Cl.
| | | |
|---|---|---|
| H01L 29/778 | (2006.01) | |
| H01L 29/78 | (2006.01) | |
| H01L 29/40 | (2006.01) | |
| H01L 29/423 | (2006.01) | |
| H01L 29/66 | (2006.01) | |
| H01L 29/20 | (2006.01) | |

(52) U.S. Cl.
CPC .......... *H01L 29/778* (2013.01); *H01L 29/2003* (2013.01); *H01L 29/401* (2013.01); *H01L 29/4234* (2013.01); *H01L 29/4238* (2013.01); *H01L 29/42316* (2013.01); *H01L 29/42376* (2013.01); *H01L 29/66462* (2013.01); *H01L 29/7787* (2013.01); *H01L 29/78* (2013.01)

(58) Field of Classification Search
CPC ............. H01L 29/2003; H01L 29/401; H01L 29/42316; H01L 29/4234; H01L 29/42376; H01L 29/4238; H01L 29/66462; H01L 29/778; H01L 29/7787; H01L 29/78
USPC .................. 257/194, 192, 76, 410, 367, 189; 438/172, 199, 689

See application file for complete search history.

(56) References Cited

U.S. PATENT DOCUMENTS

| | | | | |
|---|---|---|---|---|
| 5,793,055 | A * | 8/1998 | Kastalsky ....................... 257/24 |
| 6,853,016 | B2 * | 2/2005 | Kobayashi .................... 257/194 |
| 8,076,699 | B2 * | 12/2011 | Chen et al. .................... 257/194 |
| 8,501,557 | B2 * | 8/2013 | Jeon et al. ..................... 438/172 |
| 8,569,797 | B2 * | 10/2013 | Umeda et al. ................. 257/192 |
| 8,896,026 | B2 * | 11/2014 | Jeon et al. ..................... 257/192 |
| 2005/0145851 | A1 * | 7/2005 | Johnson et al. ................. 257/76 |
| 2011/0272740 | A1 * | 11/2011 | Umeda et al. ................. 257/192 |
| 2014/0159048 | A1 * | 6/2014 | Huang et al. .................... 257/76 |
| 2014/0209922 | A1 * | 7/2014 | Ota et al. ........................ 257/76 |

FOREIGN PATENT DOCUMENTS

JP 2003-209126 7/2003

* cited by examiner

*Primary Examiner* — Mohammed Shamsuzzaman

(74) *Attorney, Agent, or Firm* — Sony Corporation

(57) ABSTRACT

A semiconductor device includes: a device region having a semiconductor layer that includes a channel section; a device peripheral region adjoining the device region; a gate electrode provided within the device region, and having a boundary section that spans the device region and the device peripheral region; a conductive layer provided between the gate electrode and the semiconductor layer; and an insulating layer provided between the gate electrode in the boundary section and the semiconductor layer.

9 Claims, 12 Drawing Sheets

SEMICONDUCTOR DEVICE AND ELECTRONIC APPARATUS

CROSS REFERENCE TO RELATED APPLICATIONS

This application claims the benefit of Japanese Priority Patent Application JP 2013-44019 filed Mar. 6, 2013, the entire contents of which are incorporated herein by reference.

BACKGROUND

The present technology relates to a semiconductor device, such as a heterostructure field-effect transistor (HFET), and an electronic apparatus that includes this semiconductor device.

So-called compound semiconductors such as InP, GaAs, or GaN possess excellent properties in terms of the electron mobility, electron saturation velocity, dielectric breakdown electric field, and the like. Accordingly semiconductor devices made of compound semiconductors, such as HFETs, have increasingly been developed. The exemplary applications of such semiconductor devices may include high-frequency device units and power device units.

High-frequency or power device units, as described above, each have a plurality of semiconductor devices, and these semiconductor devices (device regions) are isolated from one another. In order to isolate each device region, two methods have typically been employed. The first method uses ion implantation for semiconductor layers. In this method, ions are injected to a semiconductor layer within a region (device peripheral region) around each device region, so that a deep level is formed and the resistance of the device peripheral region increases. The second method uses mesa isolation. In this method, a depression is formed in a semiconductor layer within a device peripheral region more deeply than a channel forming section. In a certain HFET, a depression is formed at a deeper position than a two-dimensional electron gas (2DEG) region (for example, refer to Japanese Unexamined Patent Application Publication No. 2003-209126). Then a gate electrode is provided so as to span both a device region and a device peripheral region.

SUMMARY

An insulating film is provided on the side wall of the semiconductor layer provided with the depression, because if the gate electrode is formed in contact with the side wall of the semiconductor layer, a leakage current flowing through the semiconductor layer may be generated.

Even for semiconductor devices provided with an insulating film as described above, a higher property has been in demand.

It is desirable to provide a semiconductor device which possesses a higher property, and an electronic apparatus that includes this semiconductor device.

A semiconductor device according to an embodiment of the present technology includes: a device region having a semiconductor layer that includes a channel section; a device peripheral region adjoining the device region; a gate electrode provided within the device region, and having a boundary section that spans the device region and the device peripheral region; a conductive layer provided between the gate electrode and the semiconductor layer; and an insulating layer provided between the gate electrode in the boundary section and the semiconductor layer.

An electronic apparatus according to an embodiment of the present technology is provided with a semiconductor device. The semiconductor device includes: a device region having a semiconductor layer that includes a channel section; a device peripheral region adjoining the device region; a gate electrode provided within the device region, and having a boundary section that spans the device region and the device peripheral region; a conductive layer provided between the gate electrode and the semiconductor layer; and an insulating layer provided between the gate electrode in the boundary section and the semiconductor layer.

In the semiconductor device according to the embodiment of the present technology or the electronic apparatus according to the embodiment of the present technology, a voltage is applied to the semiconductor layer from the gate electrode through the conductive layer even at a site close to the insulating layer, namely, on a periphery of the device region.

The semiconductor device according to the embodiment of the present technology and the electronic apparatus according to the embodiment of the present technology enable the reduction in the influence of parasitism components that would be generated in the insulating layer by providing the conductive layer between the gate electrode and the semiconductor layer. It is thus possible to provide a semiconductor device which possesses an enhanced property, and an electronic apparatus provided with this semiconductor device.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1A:
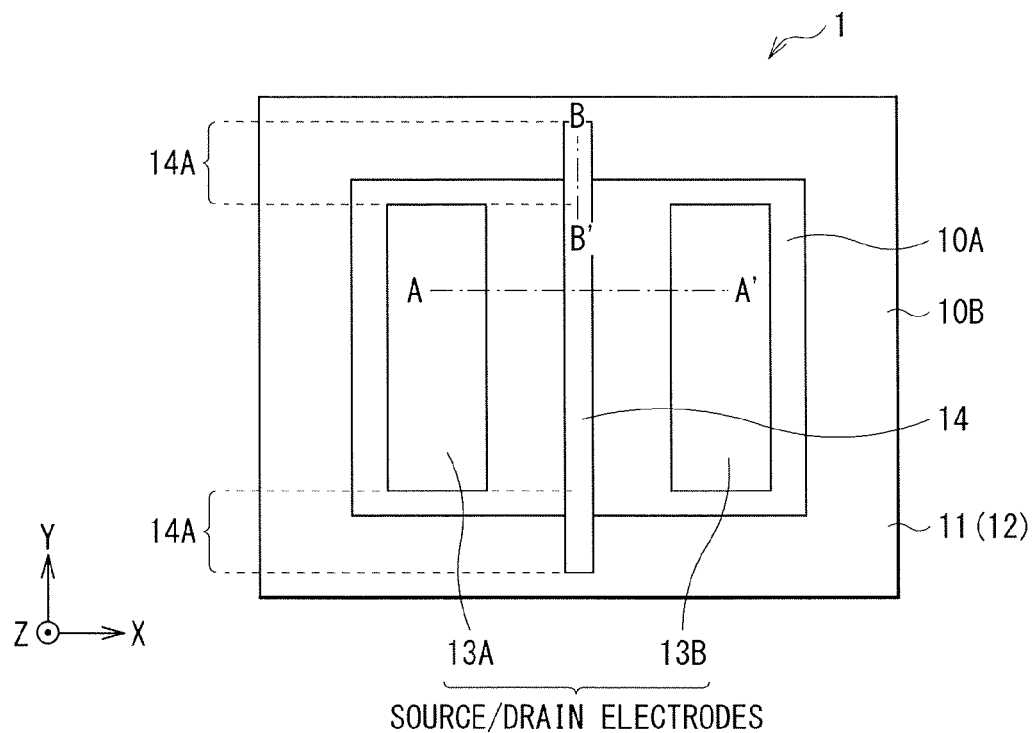
FIG. 1A is a planar view illustrating a configuration of a semiconductor device according to a first embodiment of the present technology.
Figure 1B:
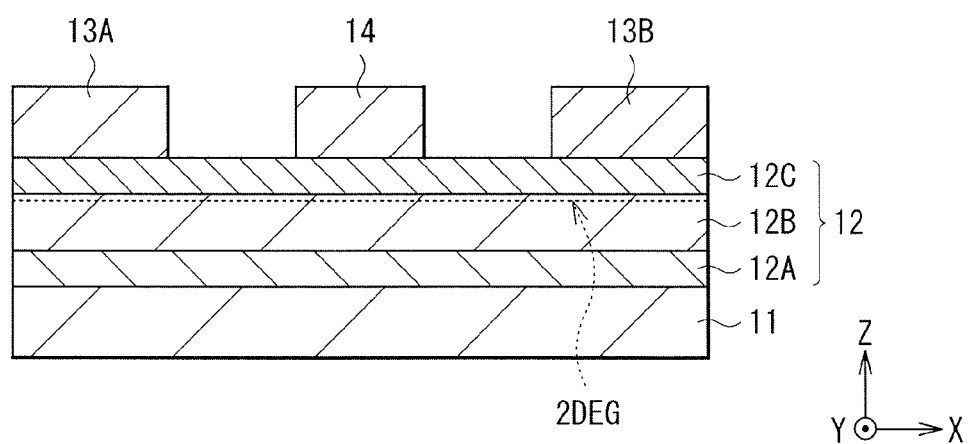
FIG. 1B is a view illustrating a cross-sectional configuration taken along a line A-A' of FIG. 1A.
Figure 1C:
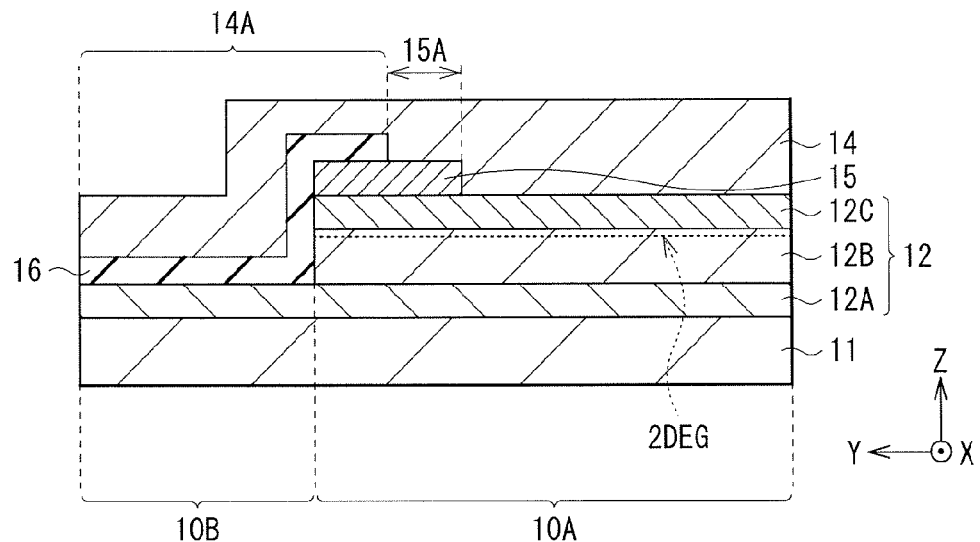
FIG. 1C is a view illustrating a cross-sectional configuration of a line B-B' of FIG. 1A.

Hereinafter some embodiments of the present technology will be described in detail with reference to the accompanying drawings. The description will be given in the following order.
1. First embodiment (mesa separation: an example in which a conductive layer is disposed between a gate electrode and a semiconductor layer)
2. Modification 1 (an example in which a side of the conductive layer makes contact with the gate electrode)
3. Modification 2 (an example in which a gate insulating film is disposed)
4. Modification 3 (an example in which the conductive layer is exposed from an opening)
5. Modification 4 (an example in which the conductive layer is formed using part of the semiconductor layer)
6. Second embodiment (device isolation by ion implantation)
[First Embodiment]
FIGS. 1A, 1B, and 1C illustrate a configuration of a semiconductor device (semiconductor device 1) according to a first embodiment of the present technology. FIG. 1A illustrates a planar configuration; FIGS. 1B and 1C illustrate cross-sectional configurations taken along lines A-A' and B-B' of FIG. 1A, respectively. The semiconductor device 1 is a field-effect transistor, and has a semiconductor layer 12 on a substrate 11. Source/drain electrodes 13A and 13B and a gate electrode 14 are provided on the semiconductor layer 12. The semiconductor layer 12 has a buffer layer 12A, a channel layer 12B (channel section), and a barrier layer 12C in this order with respect to the substrate 11 (refer to FIGS. 1B and 1C). The semiconductor device 1 may be, for example, a so-called normally-on transistor, which is turned off when a negative voltage is applied to the gate electrode 14.

The semiconductor device 1 is provided with a device region 10A in the center and a device peripheral region 10B that surrounds the device region 10A; a step is created between the device region 10A and the device peripheral region 10B. Specifically the semiconductor device 1 employs a mesa isolation structure. The gate electrode 14 extends from the device region 10A to the device peripheral region 10B, and has parts (boundary sections 14A) that span both the device region 10A and the device peripheral region 10B. An insulating layer 16 is provided between the semiconductor layer 12 and each boundary section 14A of the gate electrode 14. A description will be given below of the configurations of the individual sections configuring the semiconductor device 1.

The substrate 11 is a semi-insulating substrate, and may be configured with, for example, a sapphire substrate. The material of the substrate 11 may be selected depending on the semiconductor layer 12, and examples thereof may include InP, Si, SiC, GaN, and GaAs.

The buffer layer 12A prevents a distortion or the like that would arise due to the lattice mismatch between the substrate 11 and the channel layer 12B from being transferred to the channel layer 12B. Provision of the buffer layer 12A may be optional. The channel layer 12B (second semiconductor layer) has a two-dimensional electron gas region 2DEG in the vicinity of an interface (heterojunction surface) with the barrier layer 12C, and carriers (electrons) move in the interior of the two-dimensional electron gas region 2DEG. The barrier layer 12C (first semiconductor layer) forms the above heterojunction surface together with the channel layer 12B, and is made of a semiconductor material, the band gap of which differs from that of the constituent material of the channel layer 12B. For example, the buffer layer 12A may be made of GaN having a thickness of about 1 μm, the channel layer 12B may be made of GaN (i-GaN) having a thickness of about 100 nm, and the barrier layer 12C may be made of AlGaN (i-AlGaN) having a thickness of about 20 nm. For example, the barrier layer 12C may be an n-doped layer formed through the doping of Si to AlGaN in the barrier layer 12C. A material conforming to that of the channel layer 12B may be selected as the material of the buffer layer 12A, and this material may be a typical semiconductor material. Examples of the material of the semiconductor layer 12 may include the above GaN and AlGaN, as well as GaAs, InGaAs, InAs, InAlAs, AlGaAs, AlAs, InGaP, InGaAs, InN, InGaN, InAlN, AlN, Si, and SiGe. Alternatively the semiconductor layer 12 may be made of, for example, a quaternary material system. The configuration of the semiconductor layer 12 may be dependent on the constituent material of the channel layer 12B. For example, in the case where the channel layer 12B is made of an InP or GaAs material system, an electron supply layer (not illustrated) may be provided instead of the barrier layer 12C. The semiconductor layer 12 may employ either a lattice matching system or a lattice mismatching system.

The step is formed between the device region 10A and the device peripheral region 10B by a depression in the semiconductor layer 12. For example, both the channel layer 12B and the barrier layer 12C are removed from the semiconductor layer 12 in the device peripheral region 10B. The depression in the semiconductor layer 12 is formed so as to be deeper than the two-dimensional electron gas region 22DEG. For example, a depression may be provided in the individual layers (the channel layer 12B, the buffer layer 12A, and the substrate 11) at a midway location. Mesa isolation constructions of this type are applicable to semiconductor materials having a smaller band gap in comparison with device isolation structures formed with the ion implantation. In device isolation structures formed with the ion implantation, ions may be activated during a manufacturing process following the ion implantation, so that the breakdown voltage of the device isolation would decrease. In contrast, Mesa isolation structures effectively avoid the occurrence of such deterioration.

The source/drain electrodes 13A and 13B are each electrically connected to the semiconductor layer 12 by making ohmic contact with the barrier layer 12C. The source/drain electrodes 13A and 13B, which make a pair, are arranged opposite each other with the gate electrode 14 therebetween, for example, within the device region 10A. Each of the source/drain electrodes 13A and 13B may be configured with, for example, a laminated film made of titanium (Ti) and gold (Au), and may have a thickness of about 5 nm to about 1000 nm. Alternatively each of the source/drain electrodes 13A and 13B may be configured with a laminated film of gold (Au) and germanium (Ge), or a metal simple substance or an alloy containing one or more of titanium (Ti), aluminum (Al), nickel (Ni), and gold (Au).

The gate electrode 14 controls the carrier density of the channel region (a region located directly under the gate electrode 14) when a gate voltage (Vg) is applied to the semiconductor device 1, and functions as a wire to which an electric potential is given. Each boundary section 14A of the gate electrode 14 extends to a region (the device peripheral region 10B) outside the device region 10A, thereby spanning both the device region 10A and the device peripheral region 10B. The boundary sections 14A of the gate electrode 14 cover the step between the device region 10A and the device peripheral region 10B. For example, the gate electrode 14 may be provided on the same layer as the source/drain electrodes 13A and 13B, and be a Schottky gate electrode in contact with the barrier layer 12C (the semiconductor layer 12). The gate electrode 14 may be configured with, for example, a laminated film made of nickel (Ni) and gold (Au), and may have a thickness of about 5 nm to about 1000 nm. The constituent material of the gate electrode 14 may be selected as appropriate, depending on that of the channel layer 12B. For example, in the case where the channel layer 12B is made of a GaN material system, the constituent material of the gate electrode 14 may be nickel (Ni), palladium (Pd), platinum (Pt), or the like. In the case where the channel layer 12B is made with a GaAs material system, the constituent material of the gate electrode 14 may nickel (Ni), titanium (Ti), or the like.

Figure 2A:
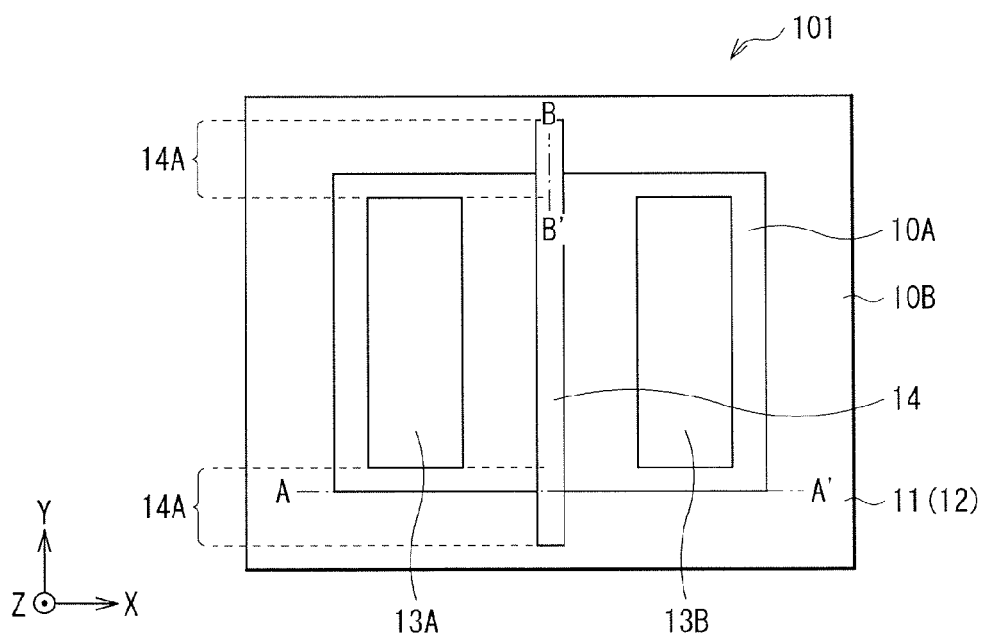
FIG. 2A is an explanatory planar view illustrating a semiconductor device in which an insulating layer of FIG. 1 is not provided.
Figure 2B:
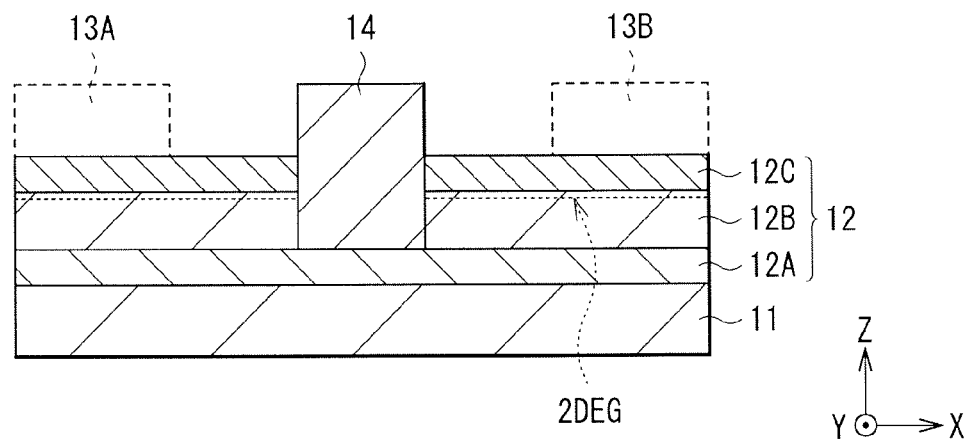
FIG. 2B is a view illustrating a cross-sectional configuration taken along a line A-A' of FIG. 2A.
Figure 2C:
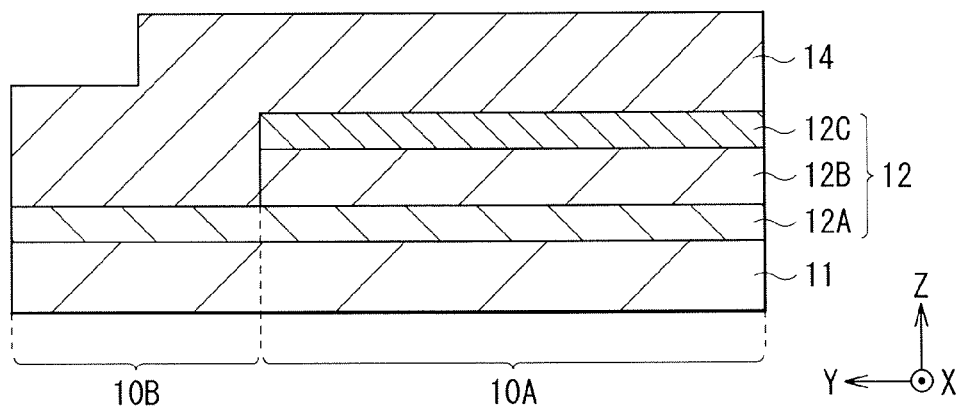
FIG. 2C is a view illustrating a cross-sectional configuration of a line B-B' of FIG. 2A.

The insulating layer 16 prevents the gate electrode 14 from making contact with the side of the semiconductor layer 12 between the device region 10A and the device peripheral region 10B. In a semiconductor device 101 that is not provided with the insulating layer 16 as illustrated in FIGS. 2A to 2C, because of the above boundary sections 14A in the gate electrode 14, the gate electrode 14 directly covers the step between the device region 10A and the device peripheral region 10B, (refer to FIGS. 2B and 2C). Since the gate electrode 14 makes contact with the side of the semiconductor layer 12, a leakage current flowing through the channel region may be generated. The insulating layer 16 disposed between the gate electrode 14 and the side of the semiconductor layer 12 suppresses the generation of the leakage current as described above. The insulating layer 16 is provided so as to extend from the side of the semiconductor layer 12 to the device peripheral region 10B and to be widened to the device region 10A by a preset length in consideration of the variation in manufacturing processing. Specifically the parts of the insulating layer 16 oppose the boundary sections 14A of the gate electrode 14. Examples of the material of the insulating layer 16 may include silicon oxide ($SiO_2$), silicon nitride ($SiN_x$), aluminum oxide ($Al_2O_3$), and oxidation hafnium ($HfO_2$). The thickness of the insulating layer 16 may be about 5 nm to about 1000 nm.

In the first embodiment, a conductive layer 15 is provided between the gate electrode 14 and the semiconductor layer 12 on the periphery of the device region 10A. In addition the conductive layer 15 makes contact with the gate electrode 14. Although details of this will be described later, the conductive layer 15 provided in this manner enables a voltage to be applied to the semiconductor layer 12 from the gate electrode 14 through the conductive layer 15, thereby reducing the influence of the parasitic transistor components that would be generated in the insulating layer 16.

Within a region of each device region 10A in which the insulating layer 16 is provided, the conductive layer 15 is disposed between the insulating layer 16 and the semiconductor layer 12. The conductive layer 15 has a part (widened section 15A) that is widened from a region of overlapping the insulating layer 16 to an inner region of the device region 10A. Through the widened section 15A, the conductive layer 15 makes contact with the gate electrode 14. A side of the conductive layer 15 (the side opposite the widened section 15A) is aligned with, for example, the step (the sides of the channel layer 12B and the barrier layer 12C) between the device region 10A and the device peripheral region 10B in planar view. The width of the conductive layer 15 (in the X direction in FIG. 1A) may be, for example, substantially the same as or larger than that of the gate electrode 14. Alternatively the width of the conductive layer 15 may be smaller than that of the gate electrode 14 unless the function of the conductive layer 15 deteriorates.

Preferably a threshold voltage ($V_{th1}$) of the periphery of the device region 10A in which the conductive layer 15 is provided may be equal to or higher than a threshold voltage ($V_{th2}$) of the center of the device region 10A in which the gate electrode 14 directly makes contact with the semiconductor layer 12 (barrier layer 12C) (expression (1)). If this relationship is satisfied, the influence of the parasitism components that would be generated due to the conductive layer 15 is suppressed more effectively.

$$V_{th1} \geq V_{th2} \qquad (1)$$

Figure 3:
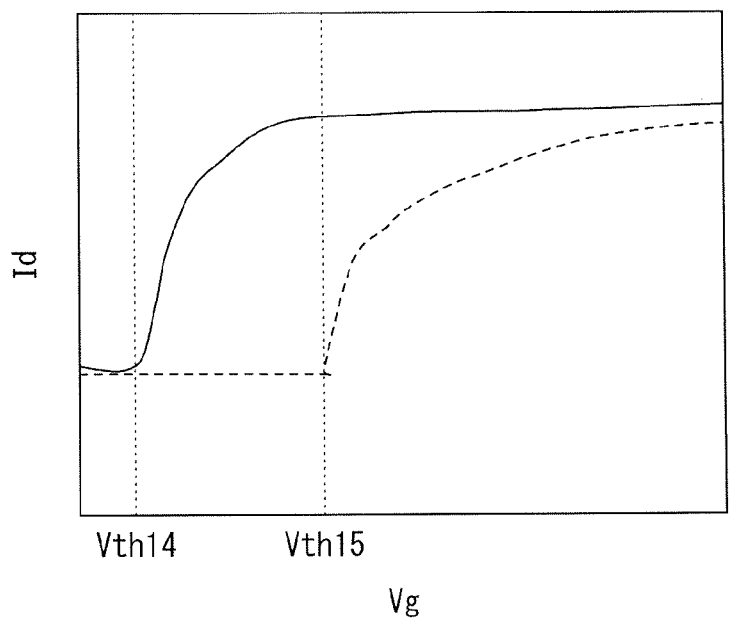
FIG. 3 is a Vg-Id characteristic diagram, which is used to explain a material of a conductive layer of FIG. 1C.
Figure 4A:
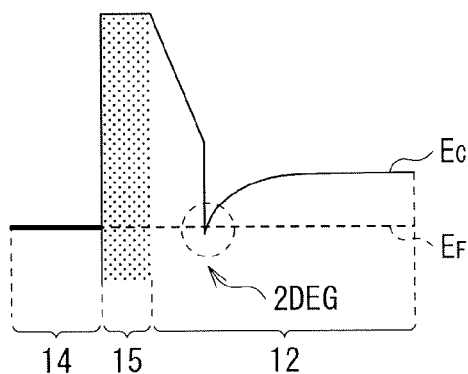
FIG. 4A is a view illustrating an energy band profile of the periphery of a device region of FIG. 1C.
Figure 4B:
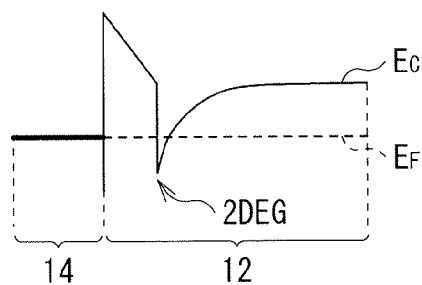
FIG. 4B is a view illustrating an energy band profile of the center of the device region of FIG. 1C.

As shown in FIG. 3, the above expression (1) is satisfied, for example, under the condition that a threshold voltage ($V_{th15}$) when a gate is made of the constituent material of the conductive layer 15 is higher than a threshold voltage ($V_{th14}$) when a gate is made of the constituent material of the gate electrode 14. Here $V_{th14}$ and $V_{th15}$ may be substantially the same level. This is because Ec (refer to FIG. 4A) of the two-dimensional electron gas region 2DEG on the periphery of the device region 10A is made higher than Ec (refer to FIG. 4B) of the center of the device region 10A, when the conductive layers 15 configured above are used. For example, when the conductive layer 15 is configured with a p-type material having the same system as in the semiconductor material of the channel layer 12B (semiconductor layer 12), the above expression (1) is satisfied. More specifically when the material of the channel layer 12B is i-GaN, the material of the conductive layer 15 may be p-GaN, p-AlGaN, p-InGaN, or the like. As long as the expression (1) is satisfied, any other material, such as a material other than a p-type one, may be used. In FIGS. 4A and 4B, $E_C$ denotes an energy level of a conduction band at a lower limit (becoming a boundary line of the conduction band and a forbidden band), and $E_F$ denotes a Fermi level.

The material of the conductive layer 15 may have a greater work function than the constituent material of the gate electrode 14. Even when the conductive layer 15 configured above is used, the above expression (1) is also satisfied. For example, when the gate electrode 14 is configured with a laminated film made of nickel (Ni) and gold (Au), the material of the conductive layer 15 may be platinum (Pt) or palladium (Pd). Unless an effect of an embodiment lessens, the threshold voltage $V_{th1}$ of the periphery of the device region 10A may be lower than the threshold voltage $V_{th2}$ of the center of the device region 10A.

The semiconductor device 1 configured above may be manufactured, for example, through the following processing (refer to FIGS. 5A to 8B). FIGS. 5A, 6A, 7A, and 8A illustrate a cross-sectional configuration taken along the line A-A' of FIG. 1A; FIGS. 5B, 6B, 7B, and 8B illustrate a cross-sectional configuration taken along the line B-B' of FIG. 1A.

Figure 5A:
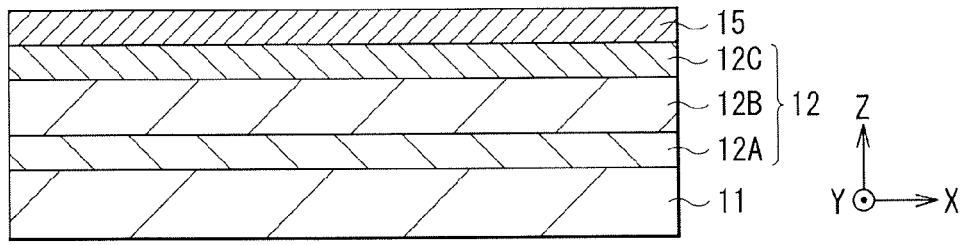
FIG. 5A is a cross-section view of an exemplary manufacturing process of the semiconductor device of FIG. 1A.
Figure 5B:
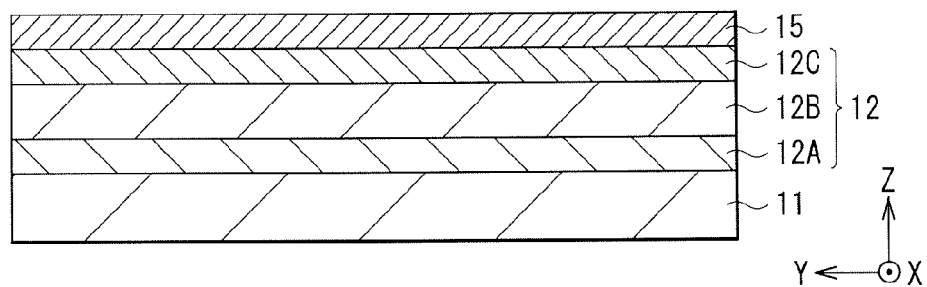
FIG. 5B is a cross-section view of the process of FIG. 5A as viewed in a different direction.

First the buffer layer 12A, the channel layer 12B, the barrier layer 12C, and the conductive layer 15 are formed on the substrate 11 in this order with a crystal growth method, such as a molecular beam emitaxy (MBE) method or a metal organic chemical vapor deposition (MOCVD) method (refer to FIGS. 5A and 5B). Alternatively the conductive layer 15 made of a metallic material may be formed with an evaporation method.

Then, for example, the conductive layer 15, the channel layer 12B, and the barrier layer 12C are patterned in desired shape, for example, with a photolithography technique and etching. As a result the depression is formed in the device peripheral region 10B, so that the step is provided between the device region 10A and the device peripheral region 10B (refer to FIGS. 6A and 6B).

Figure 7A:
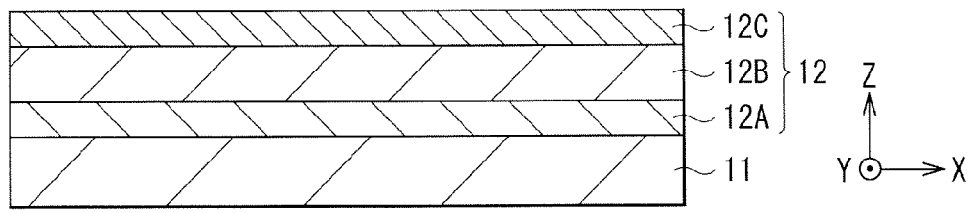
FIG. 7A is a cross-section view of a process subsequent to the process of FIG. 6A.
Figure 7B:
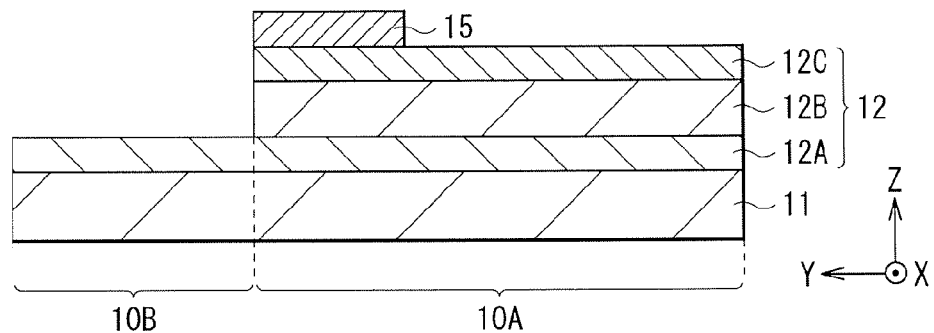
FIG. 7B is a cross-section view of a process subsequent to the process of FIG. 6B.
Figure 8A:
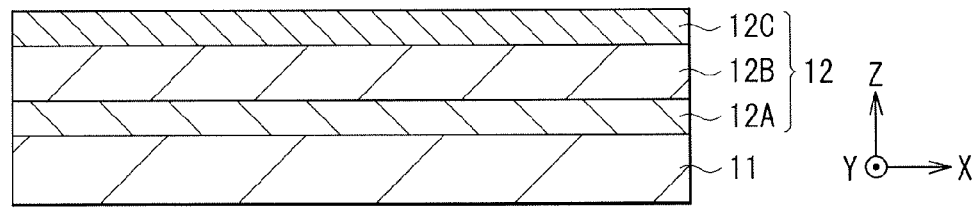
FIG. 8A is a cross-section view of a process subsequent to the process of FIG. 7A.
Figure 8B:
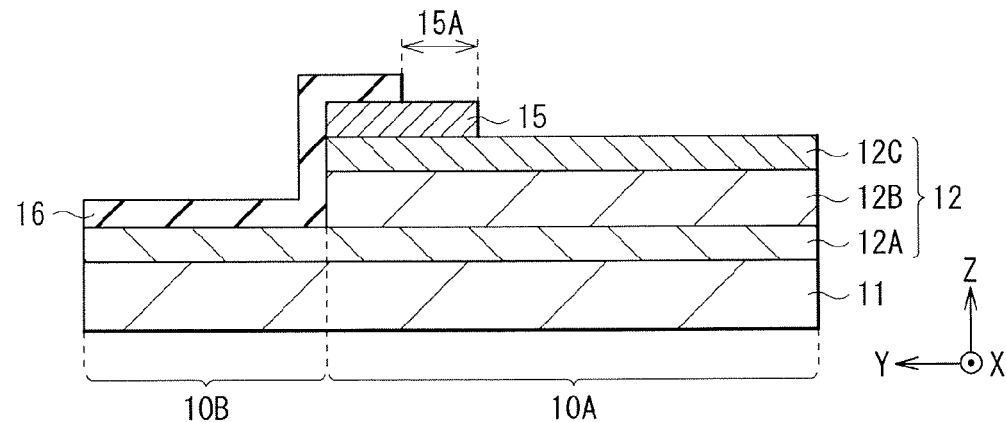
FIG. 8B is a cross-section view of a process subsequent to the process of FIG. 7B.

Subsequently the conductive layer 15 is patterned, for example, with the photolithography technique and etching (refer to FIGS. 7A and 7B). In patterning the conductive layer 15, only part of the conductive layer 15 which is formed on the periphery of the device region 10A is left and the other part is removed.

Subsequently the insulating layer 16 having a thickness of about 100 nm is formed, for example, on the entire surface of the substrate 11. Then the insulating layer 16 is patterned with the photolithography technique and etching (refer to FIGS. 8A and 8B). This patterning is performed such that the semiconductor layer 12 is exposed from the center of the device region 10A and the part (widened section 15A) of the conductive layer 15 is also exposed from the insulating layer 16. The insulating layer 16 may be formed, for example, a chemical vapor deposition (CVD) method, a physical vapor deposition (PVD) method, or an atomic layer deposition (ALD) method. After the insulating layer 16 is patterned, the source/drain electrodes 13A and 13B, each of which has a thickness of, for example, about 300 nm, are formed on the semiconductor layer 12 within the device region 10A. In addition the gate electrode 14 having a thickness of, for example, about 300 nm is also formed on the semiconductor layer 12 within the device region 10A, so as to span both the device region 10A and the device peripheral region 10B. Through the above processing, the semiconductor device 1 is completed.

When a voltage (gate voltage) that exceeds a threshold is applied to the gate electrode 14 in the semiconductor device 1 through a wiring layer (not illustrated), the electrons in the channel region directly under the gate electrode 14 are drained, and no electric current (drain current) flows, so that the semiconductor device 1 performs an off-operation. In this case the conductive layer 15 is provided between the semiconductor layer 12 and the gate electrode 14, more specifically, between the semiconductor layer 12 and the insulating layer 16, and the conductive layer 15 makes contact with the gate electrode 14 through the widened section 15A. This enables the reduction in the influence of the parasitism components that would be generated in the insulating layer 16. Details of this will be described below.

Figure 9:
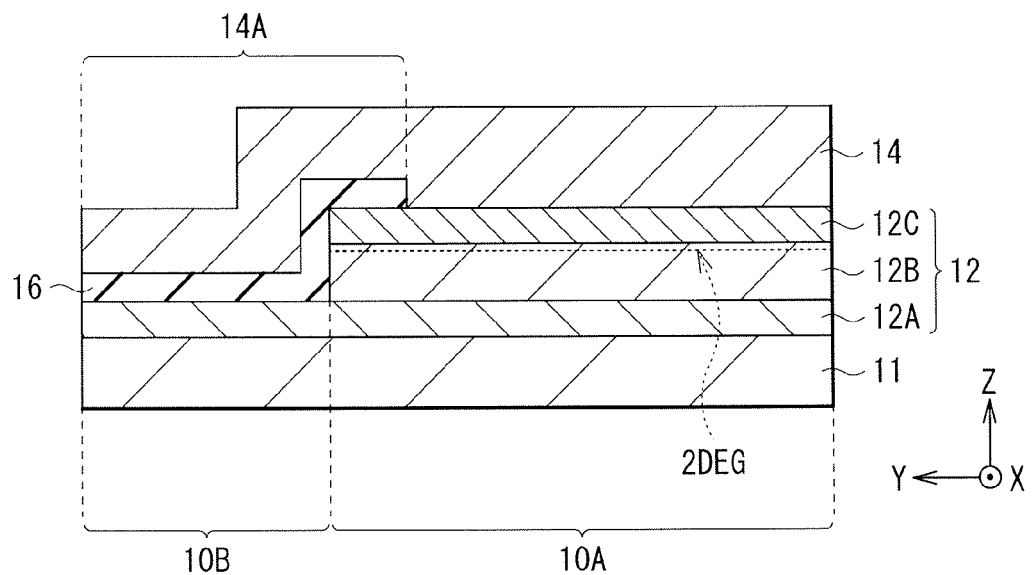
FIG. 9 is a cross-section view illustrating a configuration of a semiconductor device according to a comparative example.
Figure 10:
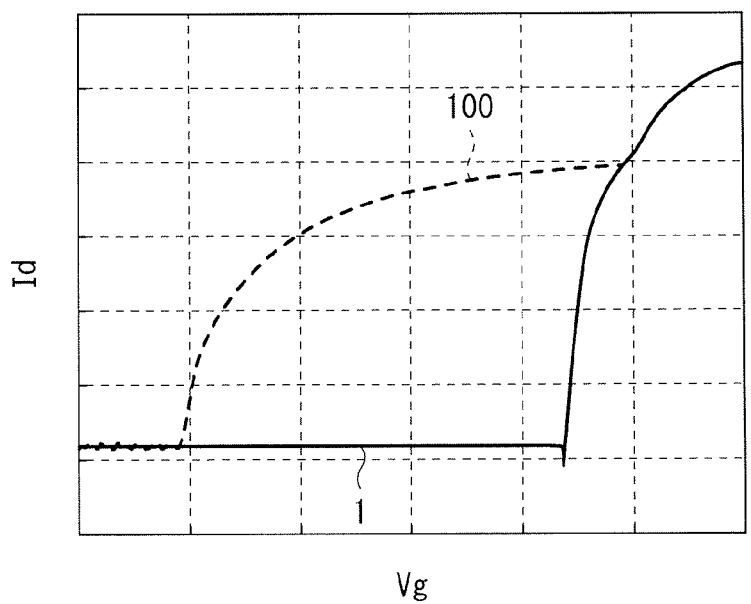
FIG. 10 is a Vg-Id characteristic diagram of the semiconductor devices of FIGS. 1C and 9.

FIG. 9 illustrates a cross-sectional configuration of a semiconductor device (semiconductor device 100) according to a comparative example. In the semiconductor device 100, no conductive layer is provided between the semiconductor layer 12 and the insulating layer 16. In addition the laminated structure of the gate electrode 14, the insulating layer 16, and the semiconductor layer 12, that is, a metal-insulator-semiconductor (MIS) structure is created on the periphery of the device region 10A. In the semiconductor device 100 configured above, a gate modulation may become less effective on the periphery of the device region 10A due to the influence of the insulating layer 16. Thus, as shown in Vg-Id characteristics of the semiconductor device 100 in FIG. 10, the parasitism components generated in the insulating layer 16 are built up, and the threshold voltage shifts toward the negative side. If a semiconductor device (e.g. the semiconductor device 101 in FIG. 2C) does not have the insulating layer 16, even when a voltage is applied to the gate in order to turn off this semiconductor device, the drain current may flow, thereby inhibiting the turn-off of the semiconductor device.

In contrast, in the semiconductor device 1, the conductive layer 15 is provided between the insulating layer 16 and the gate electrode 14, and the conductive layer 15 (the widened section 15A) makes contact with the gate electrode 14 within the device region 10A. The gate voltage is accordingly transmitted to the semiconductor layer 12 through the conductive layer 15. Therefore even when the insulating layer 16 is provided on the inner side of the device region 10A, it is possible to apply the gate voltage to the semiconductor layer 12 without undergoing the influence of the insulating layer 16 (refer to FIG. 10).

In the first embodiment, the conductive layer 15 is provided between the semiconductor layer 12 and the gate electrode 14. This prevents the shift of the threshold voltage due to parasitism components. Consequently it is possible to improve the property of the semiconductor device 1.

Also, by forming the conductive layer 15 such that the above expression (1) is satisfied, it is possible to suppress the generation of parasitism components more effectively, thereby improving the property of the semiconductor device 1.

Modifications of this first embodiment, other embodiments, and the like will be described below. In the following description, constituent elements that are the same as in the first embodiment are denoted by the same reference characters and their descriptions will be skipped as appropriate.

[Modification 1]

Figure 11:
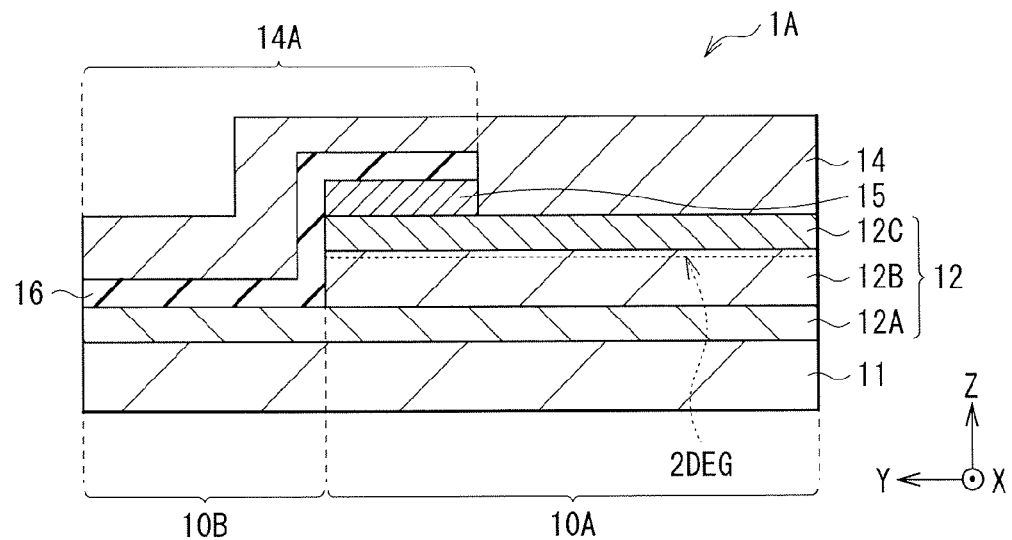
FIG. 11 is a cross-section view illustrating a configuration of a semiconductor device according to a modification 1.

FIG. 11 illustrates a cross-sectional configuration of a semiconductor device (semiconductor device 1A) according to a modification 1 of the foregoing first embodiment. In the semiconductor device 1A, the other side of the conductive layer 15 is aligned with the side (the device region 10A) of the insulating layer 16 in planar view. Except for this feature, the semiconductor device 1A has substantially the same configuration as the semiconductor device 1 of the first embodiment, and a function and effect of the semiconductor device 1A are also substantially the same as those of the semiconductor device 1.

One side of the conductive layer 15 is aligned with the sides (the step between the device region 10A and the device peripheral region 10B) of the channel layer 12B and the barrier layer 12C in planar view. The other side of the conductive layer 15 is aligned with the side of the insulating layer 16 in planar view, as described above. Since the other side of the conductive layer 15 makes contact with the gate electrode 14 within the device region 10A, the gate voltage is transmitted to the semiconductor layer 12 through the conductive layer 15.

Figure 12A:
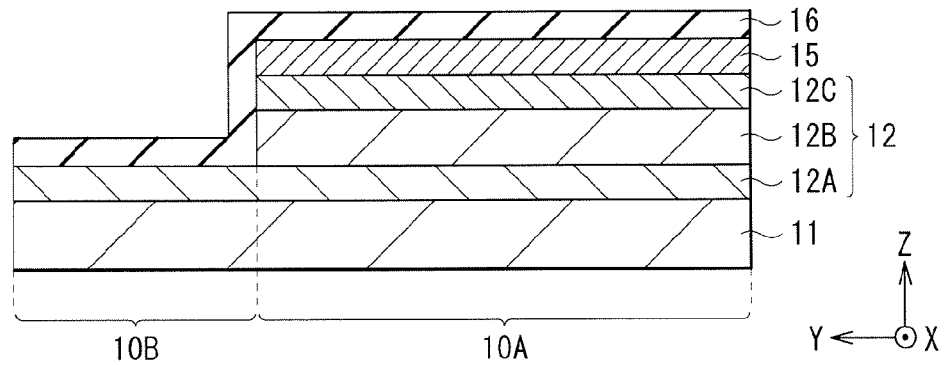
FIG. 12A is a cross-section view of an exemplary manufacturing process of the semiconductor device of FIG. 11.
Figure 12B:
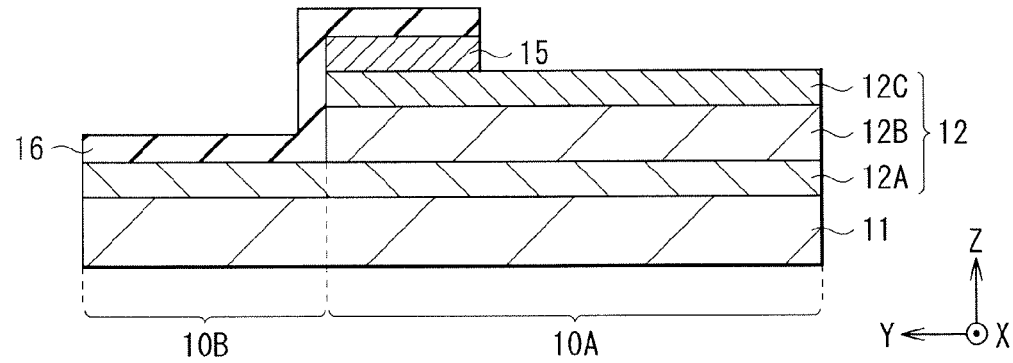
FIG. 12B is a cross-section view of a process subsequent to the process of FIG. 12A.

The semiconductor device 1A may be manufactured, for example, through the following processing (refer to FIGS. 12A and 12B).

Figure 6A:
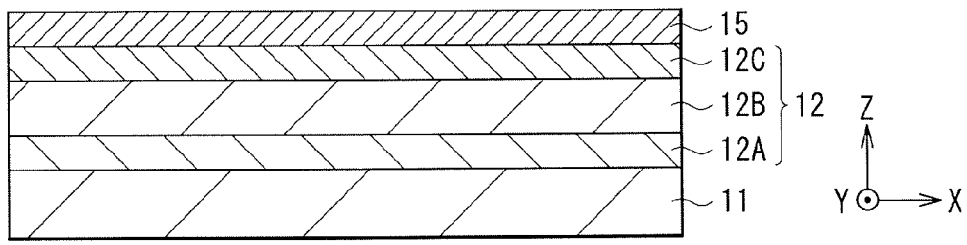
FIG. 6A is a cross-section view of a process subsequent to the process of FIG. 5A.
Figure 6B:
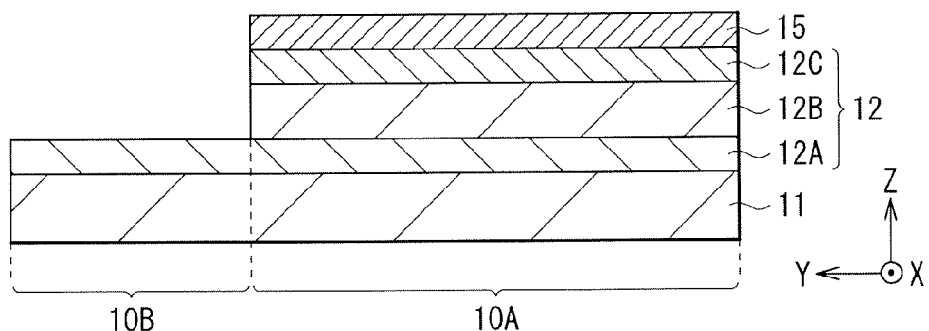
FIG. 6B is a cross-section view of a process subsequent to the process of FIG. 5B.

First, the step is provided between the device region 10A and the device peripheral region 10B, similar to the description of the first embodiment (refer to FIGS. 6A and 6B). Subsequently the insulating layer 16 is formed on the entire surface of the substrate 11 (refer to FIG. 12A) prior to patterning of the conductive layer 15. Then the conductive layer 15 and the insulating layer 16 are patterned with the photolithography technique and etching (refer to FIG. 12B). After that, the source/drain electrodes 13A and 13B and the gate electrode 14 are formed so that the semiconductor device 1A is completed.

In the semiconductor device 1A, as described above, it is possible to pattern both the conductive layer 15 and the insulating layer 16 with the same photolithography process, because the side of the insulating layer 16 and the other side of the conductive layer 15 are arranged at the same location in planar view. Therefore the manufacturing processing is simplified.

[Modification 2]

Figure 13A:
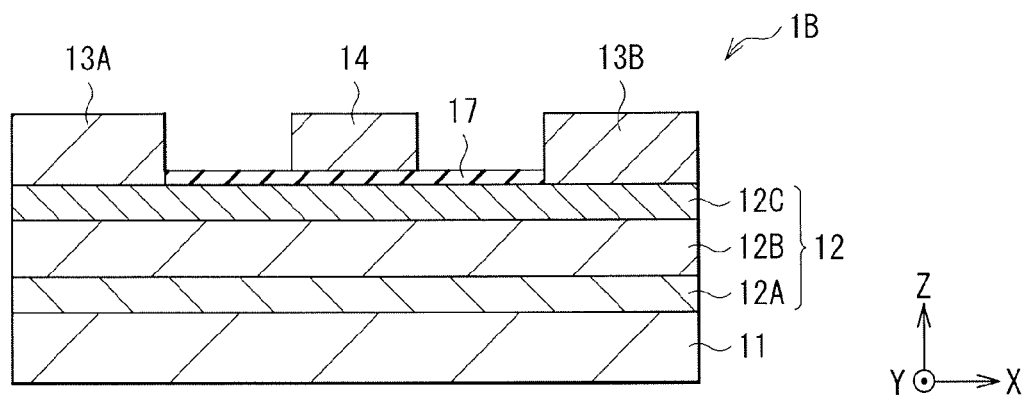
FIG. 13A is a cross-section view illustrating a configuration of a semiconductor device according to a modification 2.
Figure 13B:
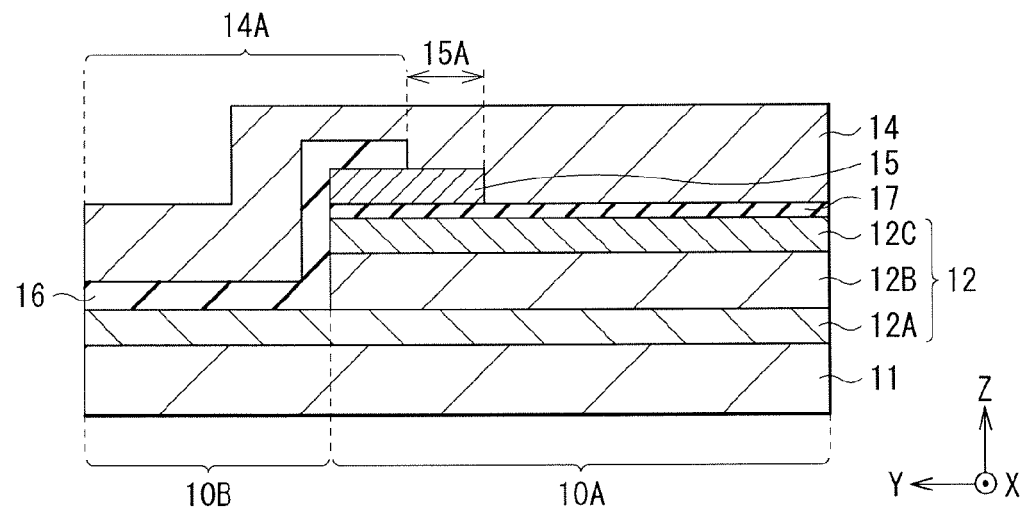
FIG. 13B is a cross-section view of the process of FIG. 13A as viewed in a different direction.

FIGS. 13A and 13B illustrate a cross-sectional configuration of a semiconductor device (semiconductor device 1B) according to a modification 2 of the foregoing first embodiment. The semiconductor device 1B employs a MIS gate structure in which a gate insulating film (gate insulating film 17) is provided between the semiconductor layer 12 and the gate electrode 14. Except for this feature, the semiconductor device 1B has substantially the same configuration as the semiconductor device 1, as described above, of the first embodiment, and a function and effect of the semiconductor device 1B are also substantially the same as those of the semiconductor device 1.

For example, the gate insulating film 17 is provided within the device region 10A, and is disposed between the semiconductor layer 12 and the conductive layer 15 on the periphery of the device region 10A. The source/drain electrodes 13A and 13B make contact with the semiconductor layer 12, similar to the foregoing semiconductor device 1. Either the widened section 15A (refer to FIG. 13B) or the other side (refer to FIG. 11) of the conductive layer 15 may make contact with the gate electrode 14.

[Modification 3]

Figure 14:
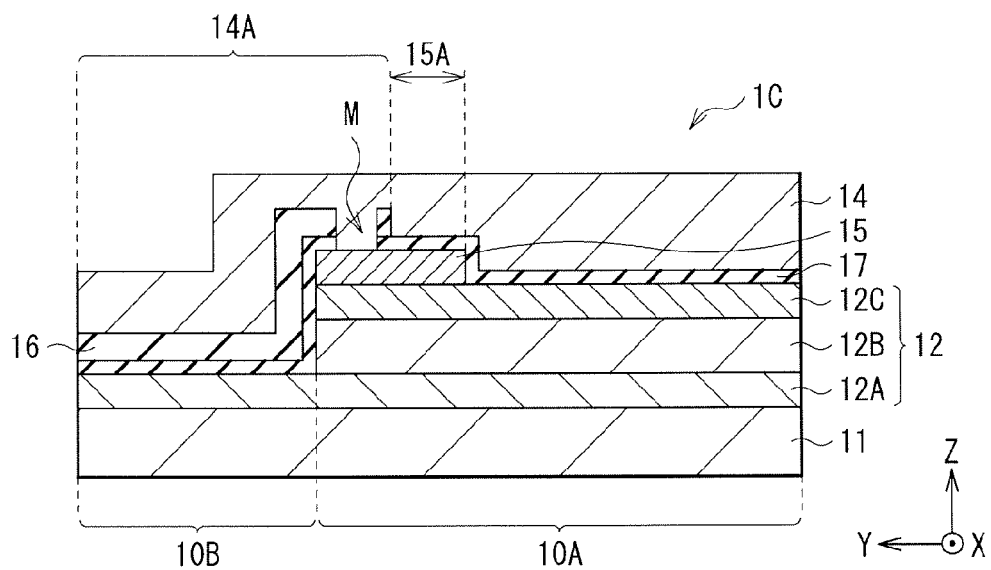
FIG. 14 is a cross-section view illustrating a configuration of a semiconductor device according to a modification 3.

As illustrated in FIG. 14, the gate insulating layer 17 may be disposed between the conductive layer 15 and the gate electrode 14 on the periphery of the device region 10A. A semiconductor device (semiconductor device 1C) according to a modification 3 of the foregoing first embodiment has the above gate insulating layer 17.

Figure 15:
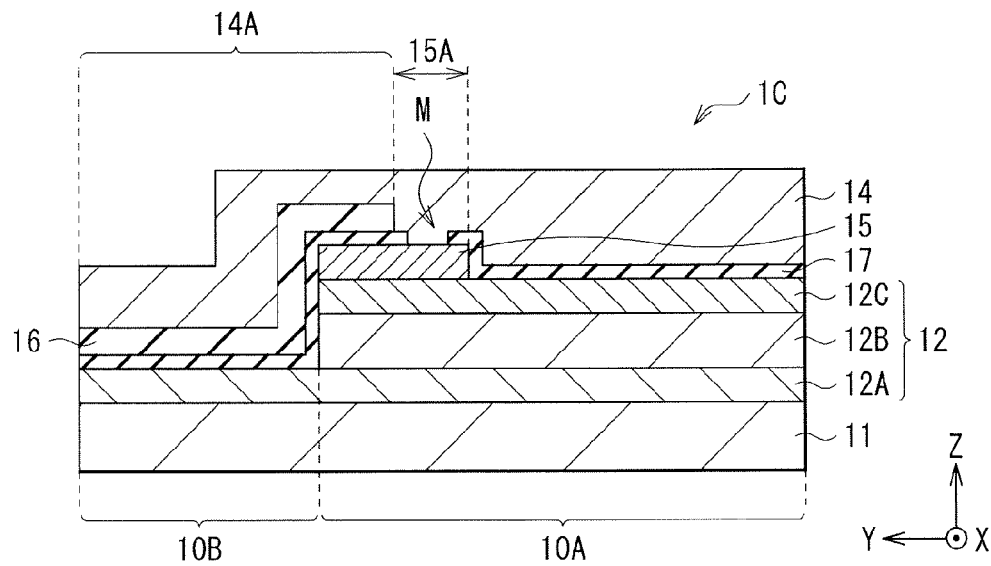
FIG. 15 is a cross-section view illustrating another example of the semiconductor device of FIG. 14.

In the semiconductor device 1C, since the conductive layer 15 is covered by the gate insulating layer 17, an opening M is provided in the gate insulating layer 17 within the device region 10A. The conductive layer 15 is exposed from the opening M, and makes contact with the gate electrode 14 through the opening M. The opening M may be provided across both the gate insulating layer 17 and the insulating layer 16, as illustrated in FIG. 14. Alternatively the opening M may be provided above the widened section 15A in the conductive layer 15 and across only the gate insulating layer 17, as illustrated in FIG. 15.

[Modification 4]

Figure 16:
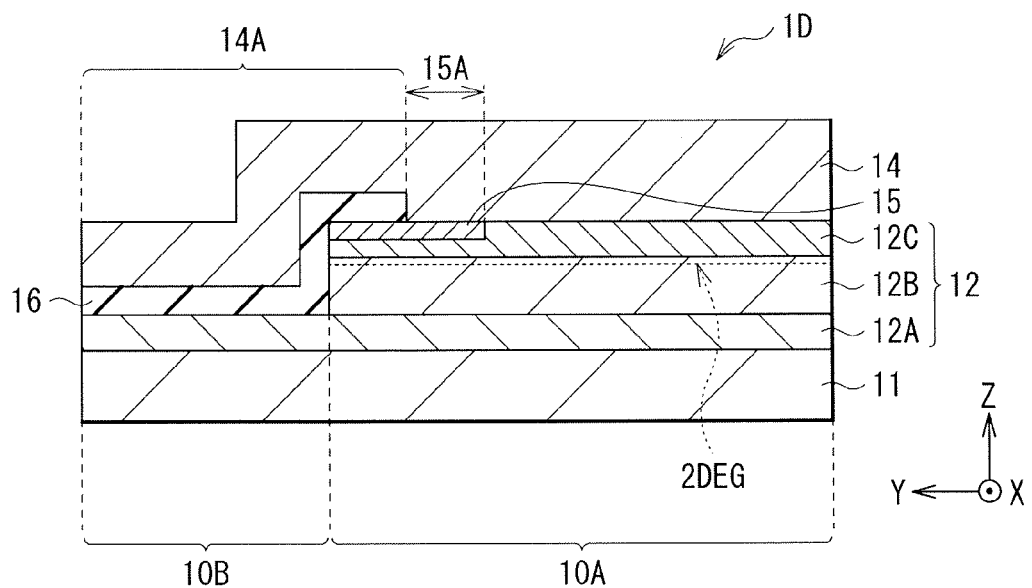
FIG. 16 is a cross-section view illustrating a configuration of a semiconductor device according to a modification 4.

FIG. 16 illustrates a cross-sectional configuration of a semiconductor device (semiconductor device 1D) according to a modification 4 of the foregoing first embodiment. In the semiconductor device 1D, the respective upper surfaces of the conductive layer 15 and the barrier layer 12C (the semiconductor layer 12) are flush with each other. Except for this feature, the semiconductor device 1D has substantially the same configuration as the semiconductor device 1 of the foregoing first embodiment, and a function and effect of the semiconductor device 1D are also substantially the same as those of the semiconductor device 1.

The conductive layer 15 in the semiconductor device 1D is formed through the application of the ion implantation using p-type dopants such as Mg and Zn to, for example, the periphery of the barrier layer 12C. Since the conductive layer 15 is formed by the transformation of the part of the barrier layer 12C, as described above, the conductive layer 15 and the barrier layer 12 in the semiconductor device 1D are flush with each other.

Figure 17:
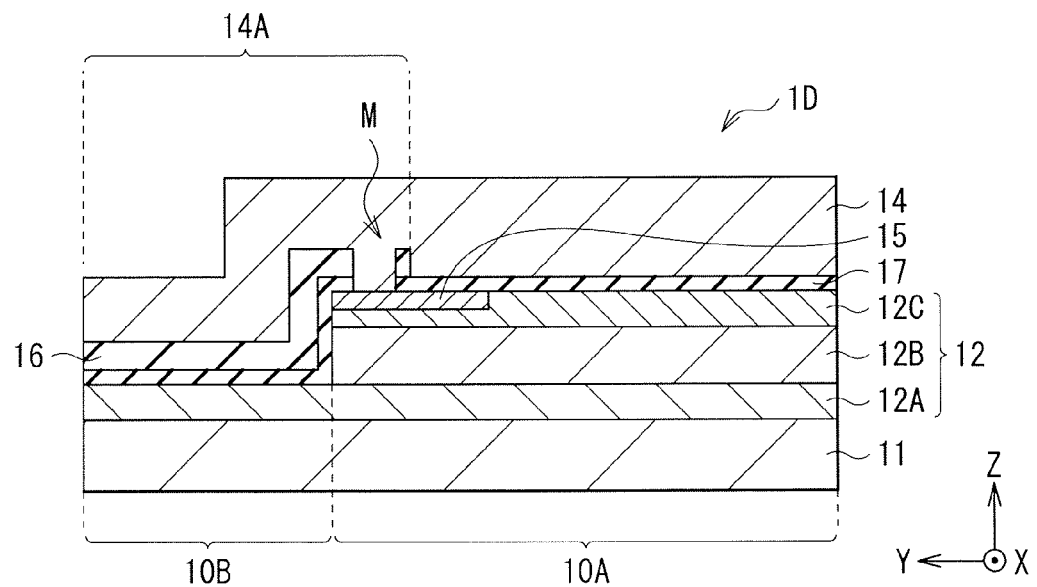
FIG. 17 is a cross-section view illustrating another example of the semiconductor device of FIG. 16.

The gate insulating layer 17 may be provided in the semiconductor device 1D. In the case where the gate insulating layer 17 is disposed between the insulating layer 16 and the conductive layer 15 on the periphery of the device region 10A, for example, the opening M from which the conductive layer 15 is exposed may be provided, as illustrated in FIG. 17.

[Second Embodiment]

Figure 18:
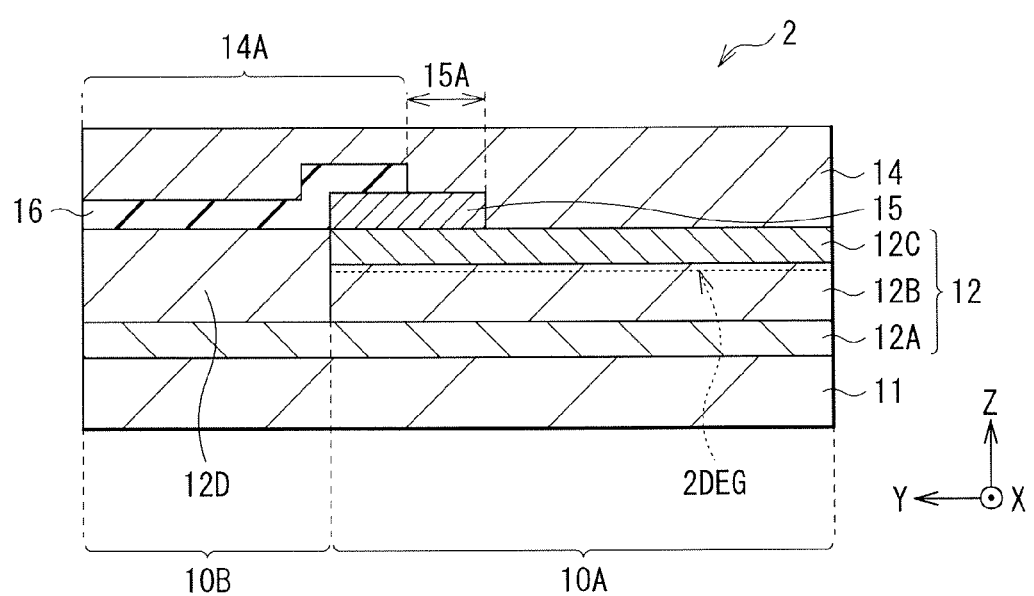
FIG. 18 is a cross-section view illustrating a configuration of a semiconductor device according to a second embodiment of the present technology.

FIG. 18 illustrates a cross-sectional configuration of a semiconductor device (semiconductor device 2) according to a second embodiment of the present technology. In the semiconductor device 2, the semiconductor layer 12 (increased resistance section 12D) within the device peripheral region 10B has increased resistance. Except for this feature, the semiconductor device 2 has substantially the same configuration as the semiconductor device 1, as described above, of the first embodiment, and a function and effect of the semiconductor device 2 are also substantially the same as those of the semiconductor device 1.

As opposed to the foregoing semiconductor device 1 employing the mesa isolation structure, the semiconductor device 2 isolates the device region 10A from the device peripheral region 10B by subjecting the semiconductor layer 12 to the ion implantation. In this case the semiconductor device 2 has no step between the device region 10A and the device peripheral region 10B. The increased resistance section 12D of the device peripheral region 10B corresponds to a section in which the resistance of the channel layer 12B and the barrier layer 12C is increased by the ion implantation. In the case where the channel layer 12B is made of a GaN material system, the ion implantation may be performed using, for example, boron (B), nitrogen (N), argon (Ar), or iron (Fe). In the case where the channel layer 12B is made of a GaAs material system, the ion implantation may be performed using, for example, hydrogen (H), boron (B), or oxygen (0).

Even the above semiconductor device 2, which employs the element isolation structure created by the ion implantation, also enables the suppression of the influence of parasitism components that would be generated in the insulating layer 16 by providing the conductive layer 15.

(Exemplary Application)

The foregoing semiconductor devices (semiconductor devices 1, 1A, 1B, 1C, 1D, and 2) are applicable to electronic apparatuses. More specifically these semiconductor devices may be incorporated, as so-called power semiconductors, into power supply circuits in, for example, personal computers, television systems, air conditioners, vehicles, and the like. Alternatively the semiconductor devices may be provided in radio communication equipment for mobile communication systems and the like, as so-called high-frequency semiconductors. Moreover the semiconductor devices according to the embodiments and the like of the present technology are applicable to various types of electronic apparatuses.

Up to this point, the example embodiments, modifications, and the like of the present technology have been described; however the present technology is not limited to these embodiments and the like, and various modifications are possible. For example, various modifications (the modifications 1 to 4) have been applied to the semiconductor device 1 with the mesa isolation structure in the above embodiment and the like; however the same modifications are also applicable to the semiconductor device 2 (refer to FIG. 18) with the element isolation structure created by the ion implantation.

The material and thickness of each layer, the method and condition of forming each film, and the like, all of which have been described in the foregoing embodiments and the like, are not restrictive, and other material, thickness, method and/or condition may be employed.

For example, although the specific configurations of the semiconductor devices have been described in the foregoing embodiments and the like, they may have other additional constituent elements.

Furthermore, the technology encompasses any possible combination of some or all of the various embodiments described herein and incorporated herein.

It is possible to achieve at least the following configurations from the above-described example embodiments of the disclosure.

(1) A semiconductor device including:
  a device region having a semiconductor layer that includes a channel section;
  a device peripheral region adjoining the device region;
  a gate electrode provided within the device region, and having a boundary section that spans the device region and the device peripheral region;
  a conductive layer provided between the gate electrode and the semiconductor layer; and
  an insulating layer provided between the gate electrode in the boundary section and the semiconductor layer.
(2) The semiconductor device according to (1), wherein the conductive layer is provided between the insulating layer and the semiconductor layer within the device region, and part of the conductive layer makes contact with the gate electrode.
(3) The semiconductor device according to (1) or (2), wherein the conductive layer is provided on a periphery of the device region.
(4) The semiconductor device according to any one of (1) to (3), wherein the semiconductor layer includes a first semiconductor layer and a second semiconductor layer that have different band gaps from one another.
(5) The semiconductor device according to (4), wherein the first semiconductor layer and the second semiconductor layer are arranged in this order with respect to the gate electrode, and the channel section is provided in the second semiconductor layer.
(6) The semiconductor device according to any one of (1) to (5), wherein a source/drain electrode is electrically connected to the semiconductor layer within the device region.
(7) The semiconductor device according to (3), wherein a voltage is applied from the gate electrode through the conductive layer, and a threshold voltage of the periphery of the device region is equal to or higher than a threshold voltage of a center of the device region.
(8) The semiconductor device according to any one of (1) to (7), wherein the conductive layer is configured with a p-type semiconductor that is made of a material system same as a material system configuring the semiconductor layer.
(9) The semiconductor device according to any one of (1) to (8), wherein the conductive layer is made of a metallic material having a greater work function than a constituent material of the gate electrode.
(10) The semiconductor device according to any one of (1) to (9), wherein the semiconductor layer has a step between the device region and the device peripheral region, and the insulating layer covers the step of the semiconductor layer.
(11) The semiconductor device according to any one of (1) to (9), wherein the semiconductor layer within the device peripheral region has increased resistance.
(12) The semiconductor device according to any one of (1) to (11), wherein the conductive layer is widened from the insulating layer to make contact with the gate electrode.
(13) The semiconductor device according to any one of (1) to (11), wherein the conductive layer and the semiconductor layer are flush with each other.
(14) The semiconductor device according to any one of (1) to (13), further including a gate insulating layer provided between the gate electrode and the semiconductor layer.
(15) The semiconductor device according to (14), wherein the gate insulating layer has an opening, and the conductive layer makes contact with the gate electrode through the opening.
(16) The semiconductor device according to any one of (1) to (15), wherein a side of the conductive layer makes contact with the gate electrode.
(17) An electronic apparatus provided with a semiconductor device, the semiconductor device including:
  a device region having a semiconductor layer that includes a channel section;
  a device peripheral region adjoining the device region;
  a gate electrode provided within the device region, and having a boundary section that spans the device region and the device peripheral region;
  a conductive layer provided between the gate electrode and the semiconductor layer; and
  an insulating layer provided between the gate electrode in the boundary section and the semiconductor layer.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
  a device region having a first semiconductor layer and a second semiconductor layer that includes a channel section;
  a device peripheral region adjoining the device region, wherein the first and second semiconductor layers have a step between the device region and the device peripheral region;
  a gate electrode provided within the device region, and having a boundary section that spans the device region and the device peripheral region;

a conductive layer provided between the gate electrode and the first semiconductor layer, wherein a length of the conductive layer in a direction in which the gate electrode spans on the first semiconductor layer is smaller than a length of the gate electrode; and an insulating layer provided between the gate electrode and a buffer layer in the device peripheral region and partially between the gate electrode and the conductive layer in the device region, wherein a part of the conductive layer makes contact with the gate electrode, and the insulating layer covers the step.

2. The semiconductor device according to claim 1, wherein the conductive layer is provided on a periphery of the device region.

3. The semiconductor device according to claim 1, wherein the first semiconductor layer and the second semiconductor layer have different band gaps from one another.

4. The semiconductor device according to claim 3, wherein the first semiconductor layer and the second semiconductor layer are arranged sequentially with respect to the gate electrode.

5. The semiconductor device according to claim 1, wherein a source/drain electrode is electrically connected to the second semiconductor layer.

6. The semiconductor device according to claim 2, wherein a voltage is applied from the gate electrode through the conductive layer, and a threshold voltage of the periphery of the device region is equal to or higher than a threshold voltage of a center of the device region.

7. The semiconductor device according to claim 1, wherein the conductive layer is configured with a p-type semiconductor that is made of a material system same as a material system configuring the first semiconductor layer or the second semiconductor layer.

8. The semiconductor device according to claim 1, wherein the conductive layer is made of a metallic material having a greater work function than a constituent material of the gate electrode.

9. The semiconductor device according to claim 1, wherein the conductive layer is widened from the insulating layer to make contact with the gate electrode.

* * * * *